United States Patent
Watanabe

(10) Patent No.: US 7,795,666 B2
(45) Date of Patent: Sep. 14, 2010

(54) SEMICONDUCTOR TIME SWITCH SUITABLE FOR EMBEDDING IN NAND FLASH MEMORY DEVICE

(75) Inventor: Hiroshi Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 12/233,168

(22) Filed: Sep. 18, 2008

(65) Prior Publication Data

US 2009/0218613 A1 Sep. 3, 2009

(30) Foreign Application Priority Data

Feb. 29, 2008 (JP) .............................. 2008-051056

(51) Int. Cl.
*H01L 29/788* (2006.01)
(52) U.S. Cl. ..................... 257/315; 257/E29.3
(58) Field of Classification Search ................. 235/492; 257/324, 315, 393, E29.3, 314, 288, 213; 324/76.11, 765; 327/365, 337, 334; 365/185.03, 365/185.25, 185.17, 185.24; 711/115
See application file for complete search history.

(56) References Cited

U.S. PATENT DOCUMENTS

| | | | |
|---|---|---|---|
| 6,181,598 B1 * | 1/2001 | Matsubara et al. ..... 365/185.11 |
| 7,075,284 B2 | 7/2006 | Watanabe et al. |
| 7,208,933 B2 | 4/2007 | Watanabe et al. |
| 7,224,157 B2 | 5/2007 | Watanabe et al. |
| 2005/0219444 A1* | 10/2005 | Misaki et al. ................ 349/110 |
| 2008/0074180 A1 | 3/2008 | Watanabe et al. |
| 2008/0133833 A1 | 6/2008 | Watanabe |
| 2008/0181017 A1 | 7/2008 | Watanabe et al. |
| 2008/0203477 A1* | 8/2008 | Yamazaki et al. ........... 257/347 |
| 2009/0189211 A1* | 7/2009 | Orimoto et al. ............. 257/319 |

FOREIGN PATENT DOCUMENTS

JP    2008-103675    5/2008

* cited by examiner

*Primary Examiner*—Thomas L Dickey
*Assistant Examiner*—Nikolay Yushin
(74) *Attorney, Agent, or Firm*—Oblon, Spivak, McClelland, Maier & Neustadt, L.L.P.

(57) ABSTRACT

A semiconductor time switch includes a cell portion and an electron booster. The cell portion contains parallel linear semiconductor layers provided on a substrate as active areas, first and second linear conductor layers alternately formed on the linear semiconductor layers through a gate insulating film as control gates and extending so as to cross the linear semiconductor layers, and floating gates inserted into respective intersections of the linear semiconductor layers and the first linear conductor layers, and coupled to the first linear conductor layers through an inter-gate insulating film. The electron booster is provided on the substrate and includes a MOS transistor having a booster gate electrode connected to the second linear conductor layers. Both ends of the linear semiconductor layers are connected to first and second I/O terminals of the switch, respectively.

18 Claims, 16 Drawing Sheets

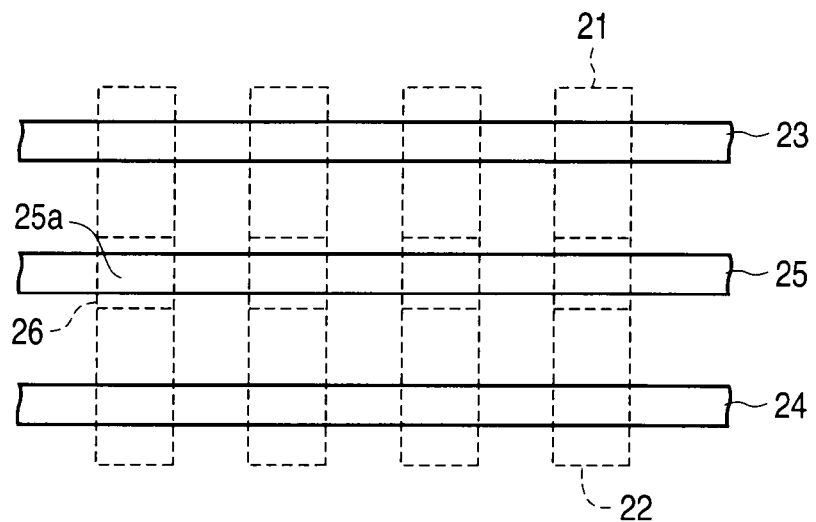
F I G. 4A
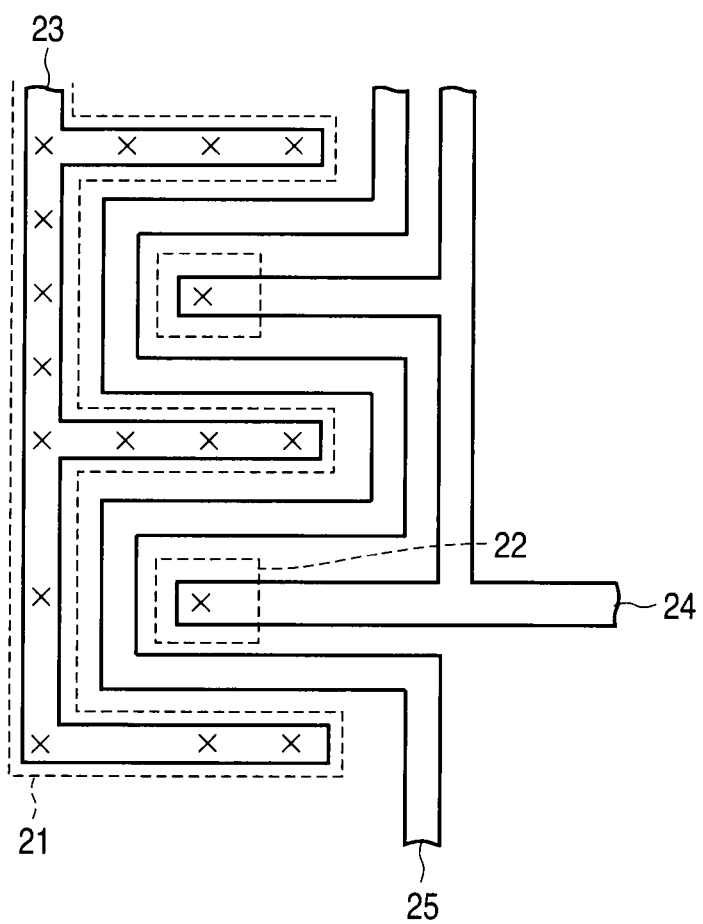
F I G. 4B

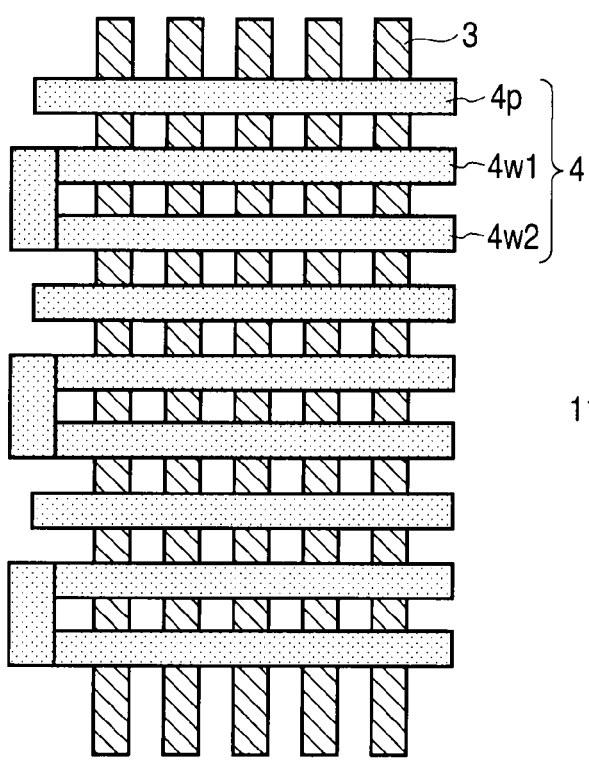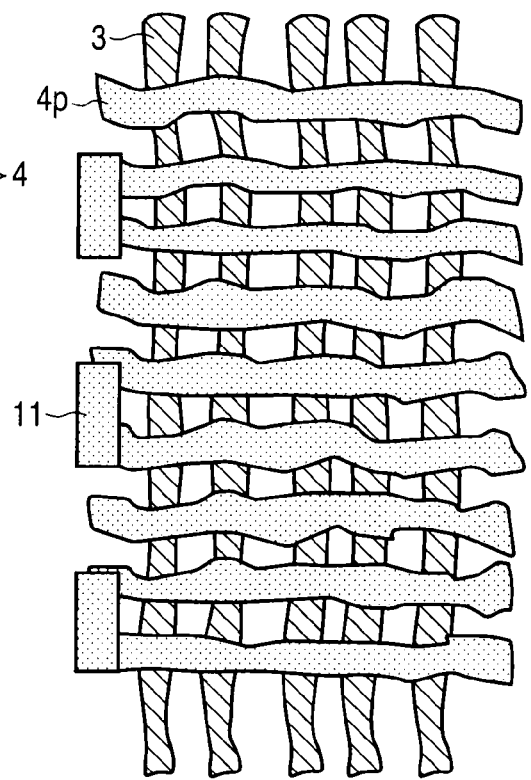
F I G. 7A    F I G. 7B

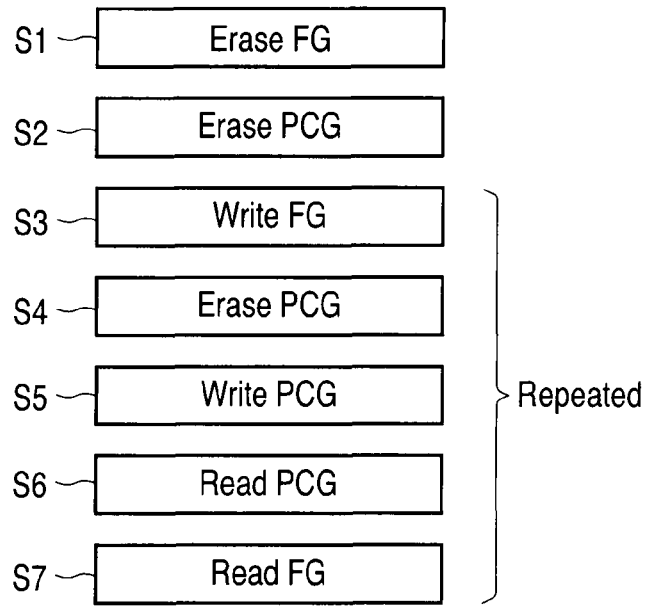
F I G. 14
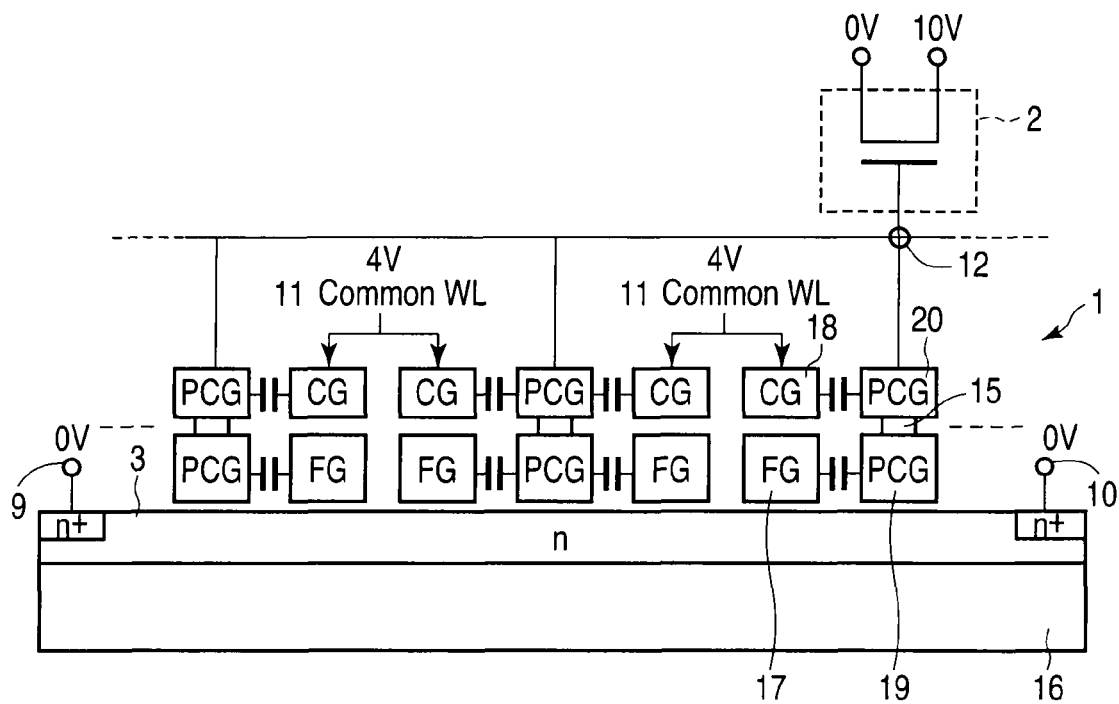
F I G. 15

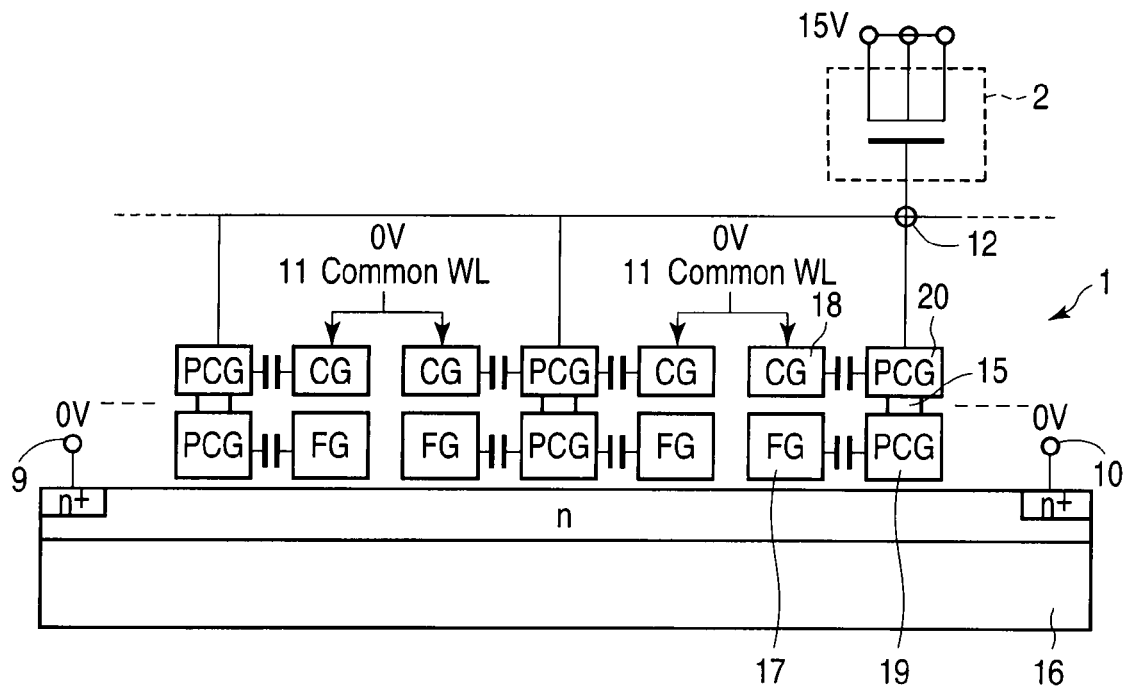
F I G. 16
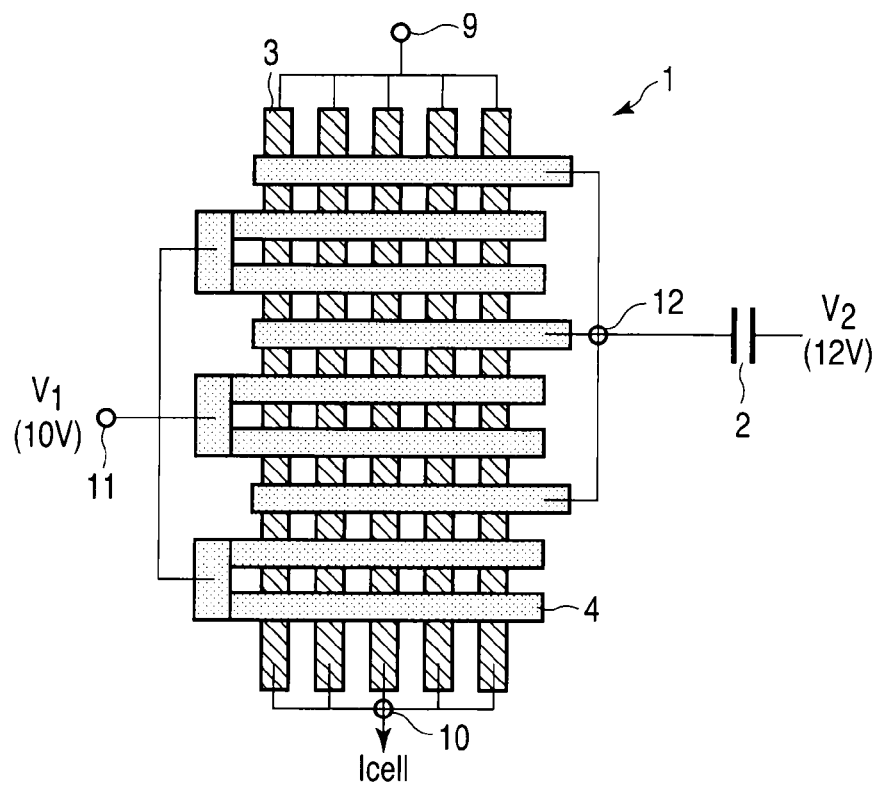
F I G. 17

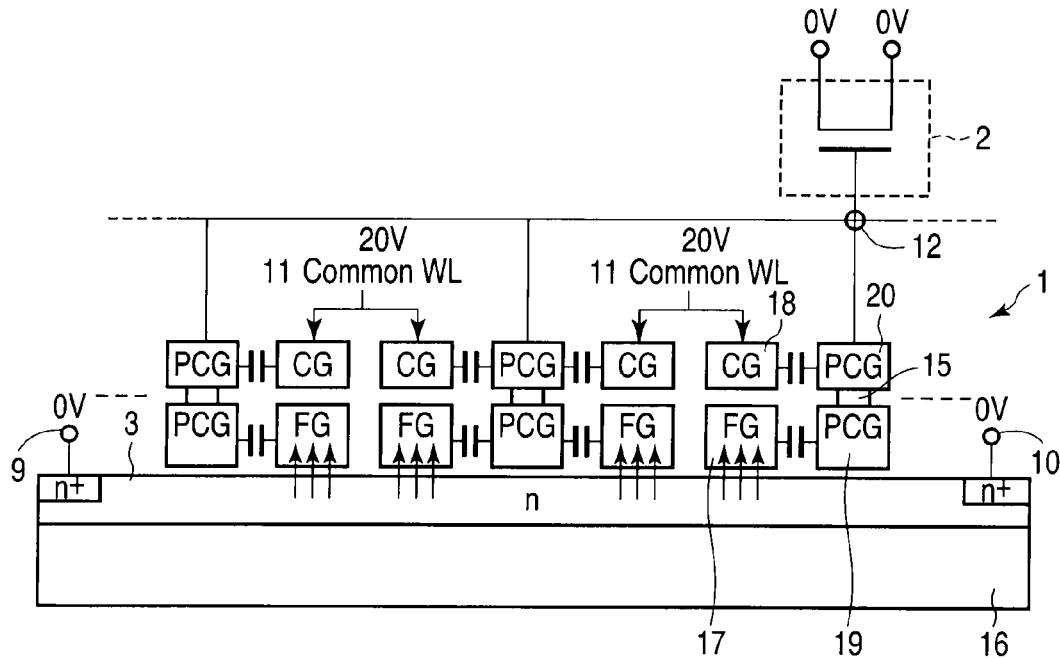
F I G. 18
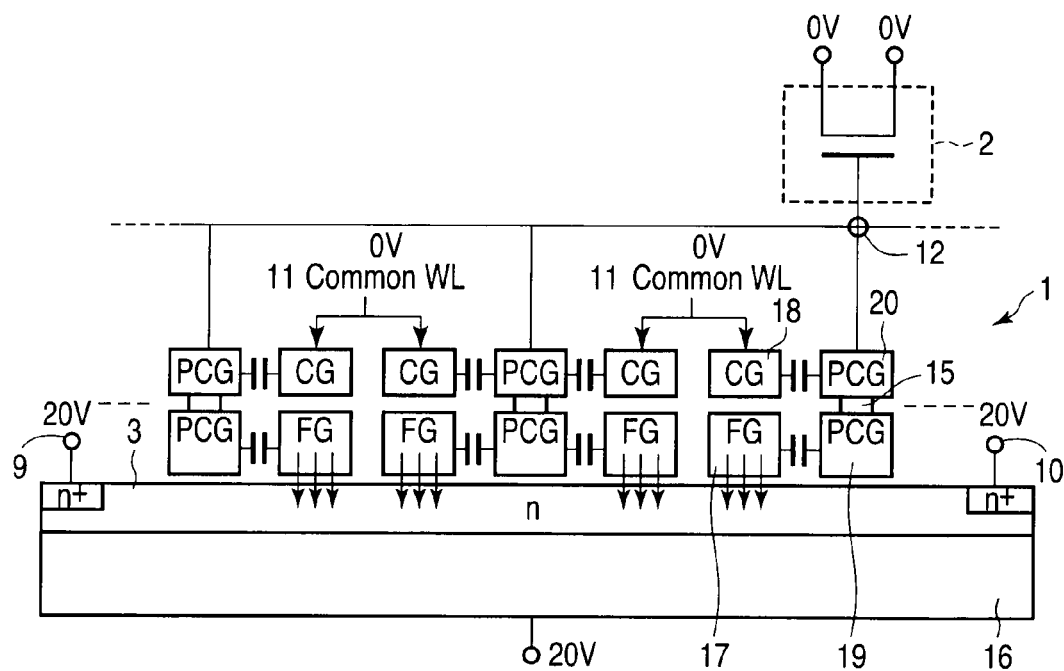
F I G. 19

SEMICONDUCTOR TIME SWITCH SUITABLE FOR EMBEDDING IN NAND FLASH MEMORY DEVICE

CROSS-REFERENCE TO RELATED APPLICATIONS

This application is based upon and claims the benefit of priority from prior Japanese Patent Application No. 2008-051056, filed Feb. 29, 2008, the entire contents of which are incorporated herein by reference.

BACKGROUND OF THE INVENTION

1. Field of the Invention

The present invention relates to a semiconductor time switch (an aging device) suitable for embedding in NAND flash memory device.

2. Description of the Related Art

A non-power semiconductor time switch (an aging device) that is interposed or connected between two functional blocks and disables mutual access between the two functional blocks after elapse of a predetermined time has been already disclosed in U.S. Pat. No. 7,224,157. Further, a technology of connecting a plurality of aging devices in parallel, in series, or in series-parallel to improve a lifetime accuracy of a time switch has been also disclosed in U.S. Pat. No. 7,075,284.

Although a basic form of the aging device is a transistor having a MOS structure, the aging device typically has a double gate structure having a floating gate and a control gate. Therefore, it is suitable for embedding in an electrically rewritable nonvolatile semiconductor memory (an EEPROM) likewise having a double gate structure.

On the other hand, in recent years, since a NAND flash memory can store a large amount of data, it is mainly used in the field of mobile devices. In the NAND flash memory, when embedding a conventional aging device is tried, since the aging device has a part that is not suitable for a manufacturing process specific to NAND, there is a problem that the aging device must be manufactured in a difference process.

Therefore, realization of an aging device that can be manufactured in the same process as the NAND flash memory and has a high lifetime accuracy has been demanded.

BRIEF SUMMARY OF THE INVENTION

According to one aspect of the invention, there is provided a semiconductor time switch comprising:

a semiconductor substrate;

a cell portion provided on the semiconductor substrate and including a first input/output terminal, a second input/output terminal and a pseudo control gate terminal, the cell portion comprising:

a plurality of linear semiconductor layers formed on the semiconductor substrate in parallel with each other in a first direction and serving as active areas, one end of each linear semiconductor layer being connected to the first input/output terminal and the other end being connected to the second input/output terminal in the cell portion;

a plurality of first gate insulating films formed on the linear semiconductor layers;

a plurality of first linear conductor layers formed on the first gate insulating films in parallel with each other, extended in a second direction crossing the first direction, and serving as control gates;

a plurality of second linear conductor layers formed on the first gate insulating films in parallel with each other, extended in the second direction, and arranged alternately with the first linear conductor layers; and floating gates inserted in intersections of the linear semiconductor layers and the first linear conductor layers, provided on the first gate insulating films, and coupled to the first linear conductor layers through inter-gate insulating films; and an electron booster provided on the semiconductor substrate and connected to the pseudo control gate terminal, the electron booster including a MOS transistor having a first source region and a first drain region formed on the semiconductor substrate, a second gate insulating film formed on a semiconductor region between the first source region and the first drain region, and a booster gate electrode formed on the second gate insulating film, the booster gate electrode being connected to the second linear conductor layers through the pseudo control gate terminal of the cell portion.

BRIEF DESCRIPTION OF THE SEVERAL VIEWS OF THE DRAWING

FIG. 4A is a plan view for explaining a parallel MOS transistor type electron booster;

FIG. 4B is a plan view for explaining a ring type electron booster;

FIGS. 7A and 7B are schematic plan views for explaining a factor of a variation in aging device lifetime, in which FIG. 7A shows a normal state and FIG. 7B shows an abnormal state;

FIG. 14 is a view showing a verification procedure of the aging device according to the first embodiment;

FIG. 15 is a view for explaining writing data into PCG cells in the aging device according to the first embodiment;

FIG. 16 is a view for explaining erasing data in the PCG cells in the aging device according to the first embodiment;

FIG. 17 is a view for explaining reading data from the PCG cells in the aging device according to the first embodiment;

FIG. 18 is a view for explaining writing data into floating gates in the aging device according to the first embodiment;

FIG. 19 is a view for explaining erasing data in the floating gates in the aging device according to the first embodiment;

DETAILED DESCRIPTION OF THE INVENTION

Embodiments according to the present invention will now be explained with reference to the drawings. It is to be noted that the drawings are of schematic types, and a relationship between a thickness and a planar dimension, a ratio of a thickness of each layer, and other aspects are different from actual. Therefore, specific thicknesses or dimensions should be judged while making reference to the following explanation. Further, it should be noted that the drawings include parts having different dimensional relationships or ratios.

First Embodiment

Figure 1:
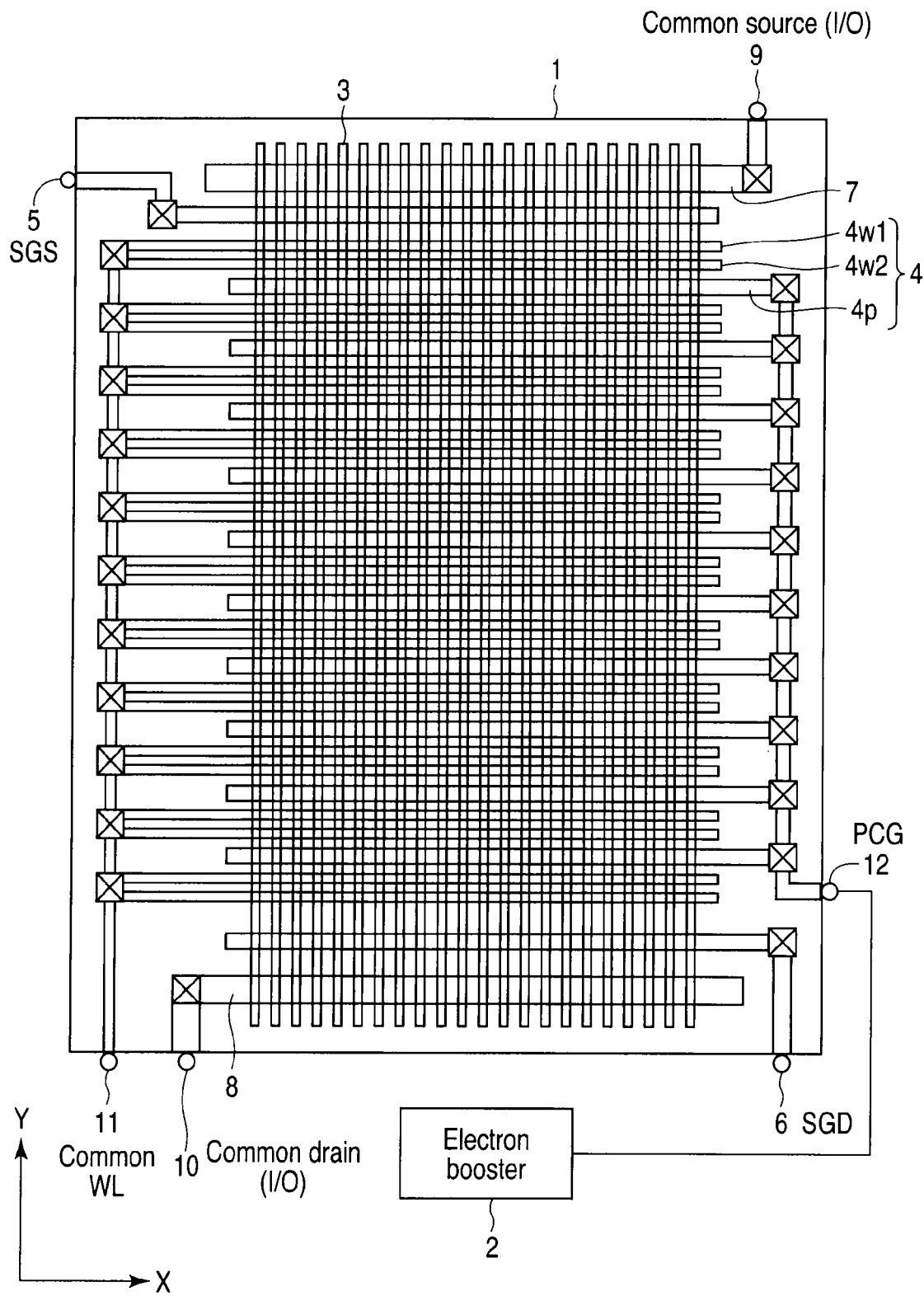
FIG. 1 is a schematic view showing a planar structure of an aging device according to a first embodiment.

FIG. 1 is a schematic view for explaining an aging device according to a first embodiment of the present invention, and a cell portion 1 and an electron booster portion 2 are formed on a NAND flash memory chip (not shown). A PCG (pseudo control gate) terminal 12 of the cell portion 1 is electrically connected to the electron booster 2.

A layout of the cell portion is schematically shown in such a manner that mask drawings are superimposed on each other in the cell portion 1. 22 pieces of active areas (n-type linear semiconductor layers) 3, which are long in a Y direction in the drawing, are formed in parallel in an X direction. 32 pieces of gate conductor lines (linear conductor layers) 4 (4$w$1, 4$w$2, 4$p$), which are long in an X direction in the drawing, are formed in parallel in the Y direction. However, the numbers of the active areas and the gate conductor lines are not restricted thereto. It is to be noted that the gate conductor line (the linear conductor layer) can be formed of polysilicon (e.g., a material having a high impurity concentration), a metal, or a laminated body including these materials.

Selecting gate lines SGS 5 and SGD 6 are formed at both ends of the alignment of the plurality of gate conductor lines 4, and a source-side n-channel selecting gate transistor and a drain-side n-channel selecting gate transistor are respectively formed at positions where the SGS 5 and the SGD 6 cross the active areas 3, as in the NAND flash memory. An n$^+$-type source contact 7 and an n$^+$-type drain contact 8 that couple the plurality of active areas 3 with each other are formed on the outer sides of the selecting gate transistors, respectively. The source contact 7 and the drain contact 8 are connected to a common source terminal 9 and a common drain terminal 10, which are input/output terminals of a semiconductor time switch (an aging device), respectively.

Further, as a structure of aging cells, a method of connecting the gate conductor lines is greatly different from that of a NAND type memory cell array. That is, as shown in the cell portion 1, the two gate conductor lines 4 (4W1, 4W2) closest to the common source terminal 9 of the cell portion 1 are first connected to each other at a left end, and the next line (4$p$) is drawn out toward the right-hand side. This arrangement conformation is repeated toward the common drain terminal 10 of the cell portion 1, and the gate conductor lines 4$w_1$ and 4$w_2$ drawn out toward the left-hand side are pulled out as a common word line 11 from the cell portion 1. On the other hand, the gate conductor lines 4$p$ drawn out toward the right-hand side are collectively pulled out as a pseudo control gate line to the PCG terminal 12. A function of the PCG (pseudo control gate) will be explained later.

Figure 2:
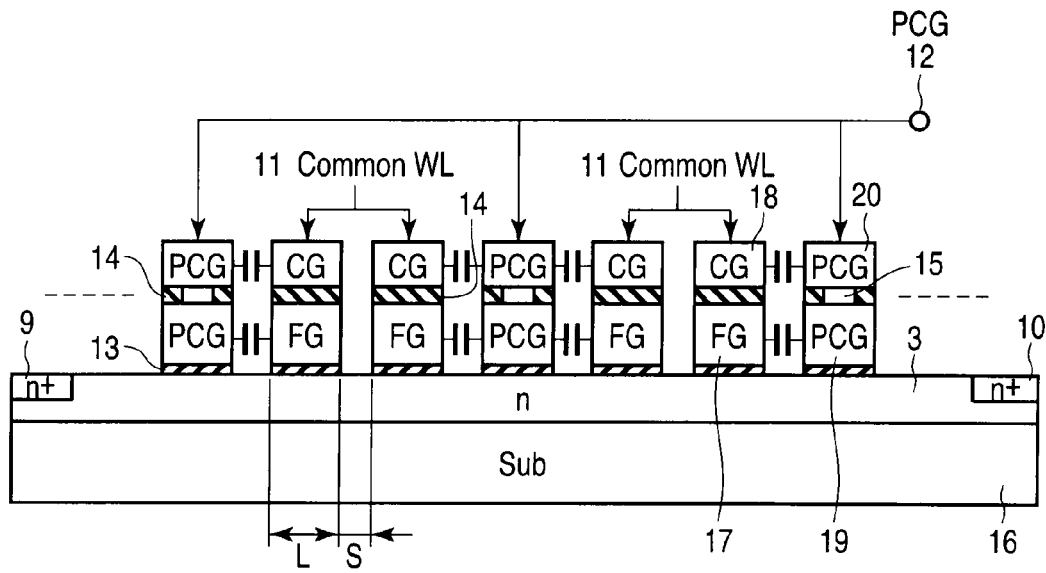
FIG. 2 is a cross-sectional view of a cell portion according to the first embodiment in an active area longitudinal (Y) direction.

FIG. 2 is a cross-sectional view taken in a longitudinal direction (the Y direction) of the active areas 3. Each n-type active area 3 is formed on a semiconductor substrate 16 (the selecting gate transistor is not shown). Pairs of cells connected to the common word line 11 and cells connected to the PCG line 12 are alternately formed on each active area 3 as explained above.

In each cell connected to the common word line 11, a floating gate (FG) 17 is formed on the active area 3 through a tunnel (gate) insulating film 13, and a control gate (CG) 18 is formed on the floating gate 17 through an inter-gate insulating film 14, as in a regular NAND flash memory. These cells are aging cells that determine a lifetime of a time switch, as will be explained later.

On the other hand, a floating gate is not present in each cell connected to the PCG line 12. Although two gate 19 and 20 are present, these gates 19 and 20 are represented as PCG (a pseudo control gate), and they are connected to each other through a conductive material 15.

That is, a process common to the NAND flash memory is used to form a contact hole in the gate 20 and the inter-gate insulating film 14. Filling this contact hole with the conductive material 15 having conductive properties enables connecting the upper gate 20 with the lower gate 19. The conductive material 15 may be formed on the gate 19 in advance, and the gate 20 may be formed thereon. Such a technique is a method that is often used when creating a selecting gate transistor (the SGS or the SGD) of the general NAND flash memory, but it is also applied when creating a PCG in this embodiment.

However, a width of the gate conductor line 4$p$ must be sufficiently large in order to form the contact hole. Therefore, a width (L) of the gate conductor line 4$p$ must be larger than a cell interval (S). This is a characteristic which cannot be observed in a memory cell of the regular NAND flash memory.

Since the cell interval (S) is narrow, an inter-cell interference occurs between the PCG 19 and the floating gate (FG) 17. In this embodiment, this inter-cell interference (a PCG-FG interference) is used to control an electric field applied to the tunnel insulating film below the floating gate 17, thereby controlling a lifetime of the aging cell.

Figure 3:
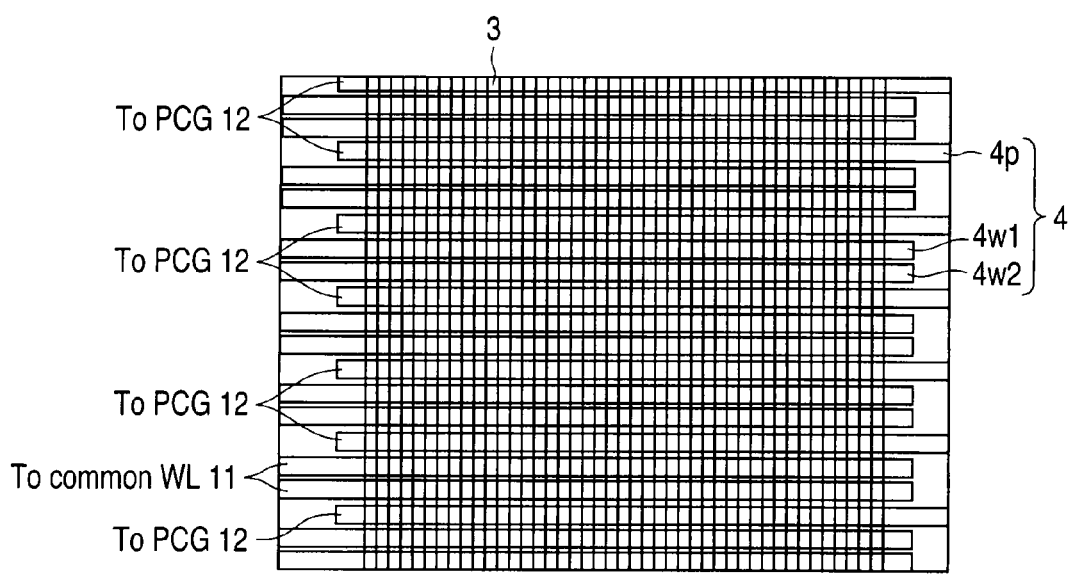
FIG. 3 is an enlarged view of the cell portion for explaining a structure of gate conductor lines.

FIG. 3 is an enlarged view of a matrix portion in the cell portion 1. A contact hole (not shown) laterally extended in parallel with each gate conductor line 4$p$ is formed in each gate conductor line 4$p$ connected to the PCG 12, and filling the contact hole with a conductive material enables connecting the conductor layer (the PCG 19) below each gate conductor line 4$p$ with the gate conductor line 4$p$ (the PCG 20).

FIGS. 4A and 4B are views showing a structure of the electron booster portion, and four MOS transistors are connected in parallel in FIG. 4A. Reference numeral 21 denotes a source region; 22, a drain region; 23, a common source line; 24, a common drain line; 25, a common booster gate line; and 26, a channel region. The number of the MOS transistors is not restricted to four, and five or more MOS transistors may be connected in parallel in accordance with a specification. The MOS transistors are connected in parallel in order to assure a quantity of electrons that are to be boosted to the gate electrodes 25. When a capacity of the electron booster is increased, electrons supplied to the PCG 19 connected to each gate conductor line 4p are not depleted, and a lifetime of the PCG 19 can be increased beyond a lifetime of the FG 17, whereby control over the FG 17 by the PCG 19 can be continued to the end.

In FIG. 4B, the source region of each transistor is arranged like a ring around the drain region, and this structure is called a ring booster. Although the number of ring boosters connected in parallel is two in this example, the number of ring boosters is not of course restricted to two. Sizes or the number of the ring boosters can be adjusted in accordance with needs and applications.

The electron booster is created as a peripheral circuit, but the gate electrode is formed with the same structure as that of the pseudo control gate (the PCG) of the cell portion 1 in this embodiment. That is, although not shown in particular, the above-explained contact hole is formed in each upper gate conductor line to couple the lower conductor layer with the upper layer.

In the ring booster 2, a wiring line having a contact directly arranged in the active area functions as a common source line 23, and a wiring line having a contact arranged in the ring-like gate conductor line serves as a common booster gate wiring line 25. That is, the booster gate electrode in the ring booster 2 couples this ring-like gate conductor layer 25a with the lower conductor layer 25b (see later-explained FIG. 5). The common booster gate wiring line 25 is connected to the PCG terminal 12 of the cell portion 1. A drain contact (the drain region 22) is arranged at the center surrounded by the ring-form gate conductor line 25 and drawn out toward the right-hand side to be connected to the drain line 24.

Figure 5:
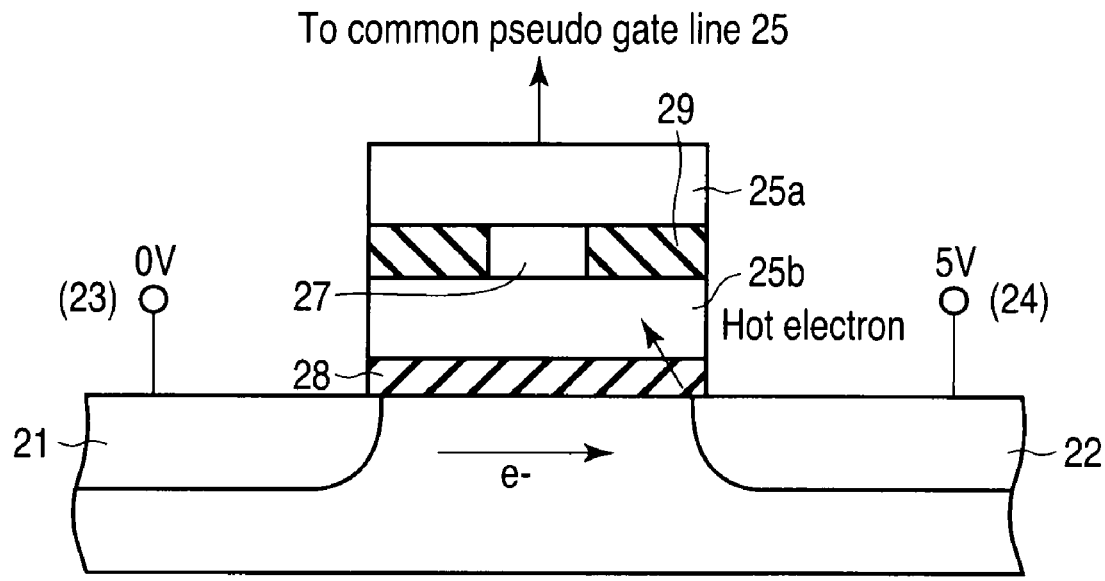
FIG. 5 is a schematic cross-sectional view for explaining a function of the electron booster.

An operation of the electron booster will now be explained. For example, as shown in FIG. 5, when 0V is applied to the source line 23 and 5V is applied to the drain line 24, electrons collected from the source region 21 by an electric field become hot electrons at a position near the drain region 22. When the booster is formed into a ring shape, since electrons are concentrated on a short periphery of the central drain region from a long periphery of the surrounding source region, a generation efficiency for the hot electrons can be increased. When a voltage is applied to the gate 25a from the PCG 12, the hot electrons are injected into the gates 25b and 25a.

In order to apply a voltage to the PCG 12, applying a voltage to the common word line 11 in the cell portion 1 can suffice. As can be understood from FIG. 2, this utilizes the inter-cell interference effect between the PCG 20 of the cell portion 1 and the control gate (CG) 18 connected to the common word line 11. Here, a point to note is a relationship between a magnitude of PCG-CG capacitive coupling and a magnitude of gate-channel capacitive coupling in the electron booster 2. When this relationship is not appropriately set, boosting electrons to the gates 25b and 25a in the electron booster 2 cannot be performed. For example, it is desirable for the magnitude of PCG-CG capacitive coupling to be larger than the magnitude of gate-channel capacitive coupling.

Figure 6:
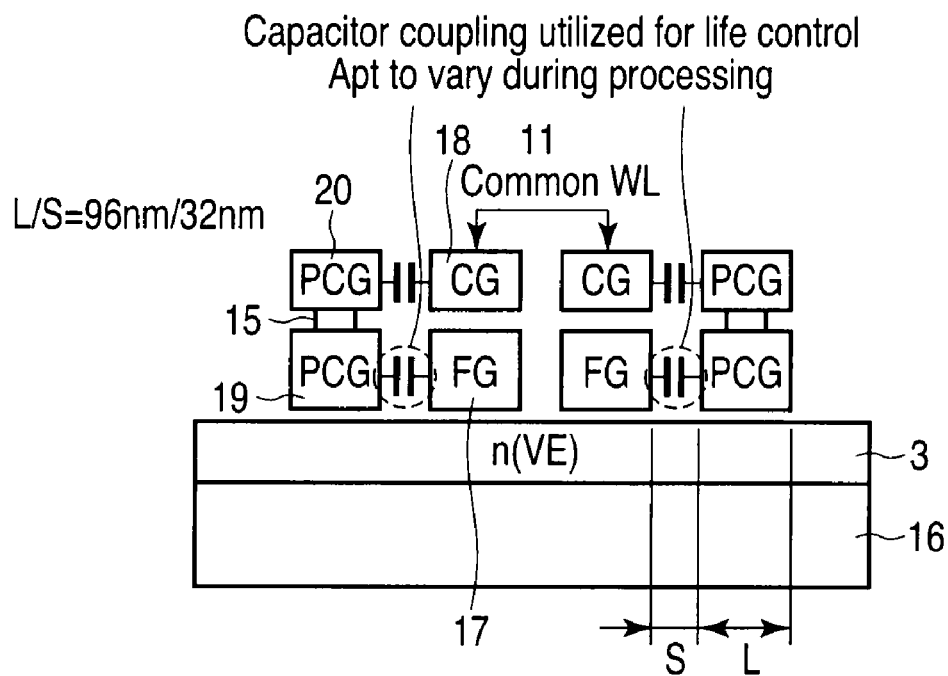
FIG. 6 is a schematic cross-sectional view for explaining a factor of a variation in aging device lifetime.

As shown in FIG. 6, a cross-sectional view taken in a vertical (Y) direction of the active areas 3 in the cell portion 1 will now be considered. Two control gates (CG) 18 that are adjacent to each other at the center are both connected to the common word line 11, and the pseudo control gates (PCG) 20 are further arranged on both sides. In this example, a gate conductor width (L) constituting the PCG 20 or the CG 18 is set to 96 nm, which is three times a conductor interval (S) of 32 nm. Of course, this ratio can be changed in many ways as long as L>S is satisfied.

A point to note here is capacitive coupling between the PCG 19 and the FG 17. A process variation of the gate conductors and the active areas provokes a variation in this capacitive coupling and eventually leads to a variation in lifetime of information recorded in the FG 17.

FIG. 7A is a schematic view of an ideal layout pattern of the active areas 3 and the gate conductor lines 4 having no process variation of the gate conductor lines. FIG. 7B is a schematic view of the same layout pattern having an extreme variation.

Here, a process variation in the gate conductors in this process variation is brought into focus. First, as shown in an upper right drawing in FIG. 8A, a consideration will be given as to a mode in which two short-circuited gate conductor lines (4W1, 4W2) are misaligned toward one side (the common drain side in this example). At this time, coupling on the common source side where the interval is increased becomes weak, and coupling on the common drain side where the interval is narrowed becomes strong. This is just an example where the variation mode is simplified, but it represents one aspect of inner natures of the structure according to this embodiment.

That is, (1) at each part where the two gate conductor lines are short-circuited, coupling between the short-circuited gate conductor lines can be ignored. (2) Since each pair of short-circuited control gates (CG) and the pseudo control gate (PCG) are alternately aligned, coupling necessarily becomes strong in either the control gates or the pseudo control gate and coupling becomes weak in the other of these gates irrespective of how a variation occurs. Since the inter-cell interference that controls the lifetime of information recorded in the floating gate (FG) is dominated by strong coupling, a mode where coupling is lower than an average value is automatically eliminated by the structure according to this embodiment as shown in FIG. 8B.

Figure 9A:
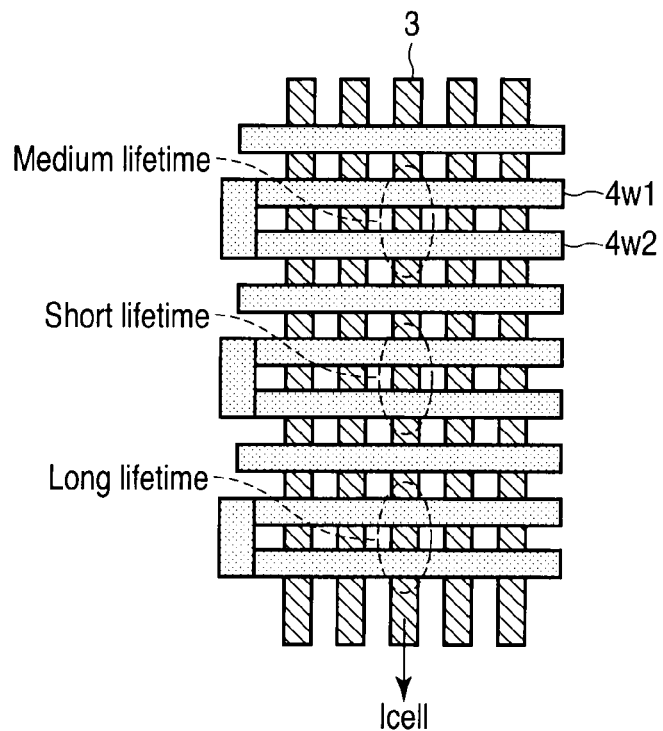
FIG. 9A is a plan view for explaining aging cells formed in series in one active area.
Figure 9B:
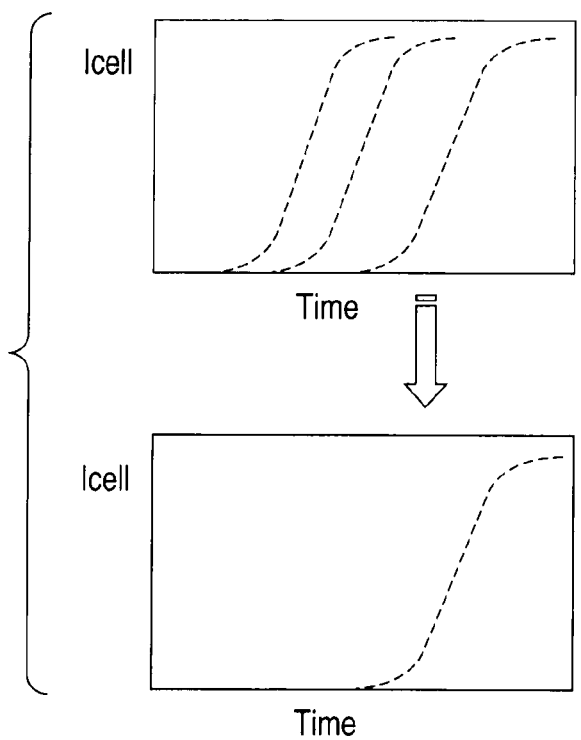
FIG. 9B is graphs for explaining a factor determining a lifetime of each aging cell string in FIG. 9A.

FIGS. 9A and 9B are views for explaining lifetimes of three cells which are continuous with the same active area 3. In this case, the cell means a pair formed of the two short-circuited gate conductor lines 4W1 and 4W2. As shown in FIG. 2, an n-type diffusion layer is formed on a surface of the active area 3 in advance.

First, as shown in FIG. 9A, it is assumed that three pairs of aging cells having a medium lifetime, a short lifetime, and a long lifetime are present from the common source side toward the common drain side. Each of the three pairs of aging cells has two floating gates (FG), and the floating gate having a longer lifetime determines a lifetime of the aging cell. Subsequently, when electrons are injected into the three pairs of (six) aging cells under the same conditions, six channels formed on the surface of the active area 3 and below the three pairs of (six) aging cells FG are all turned off, and a cell current (Icell) temporarily does not flow through the active area 3. That is, this time switch constitutes a switch which is turned off after electron charge and turned on when the end of the lifetime is reached. It is to be noted that a high voltage is applied to the PCG to cause a channel region below the PCG to enter a conductive state at the time of reading, as will be explained in a reading method later, and hence a lifetime of a device is determined by the aging cells. Furthermore, as shown in an upper drawing in FIG. 9B, Icell is increased with time in accordance with the lifetimes of the three pairs of aging cells.

Since these three pairs of cells are connected in series, the cell having the longest lifetime in a string where these cells are connected determines a lifetime of the string. In this manner, as shown in a lower drawing in FIG. 9B, the cell having the long lifetime in the string determines Icell.

Figure 10A:
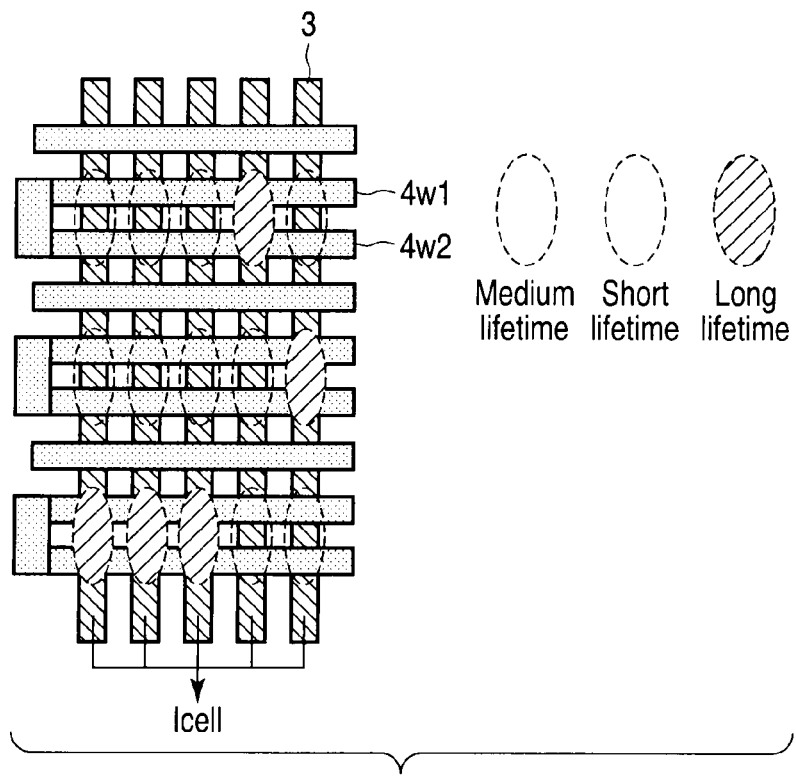
FIG. 10A is a plan view for explaining an aging device in which aging cells formed in series in a plurality of active areas are further connected in parallel.
Figure 10B:
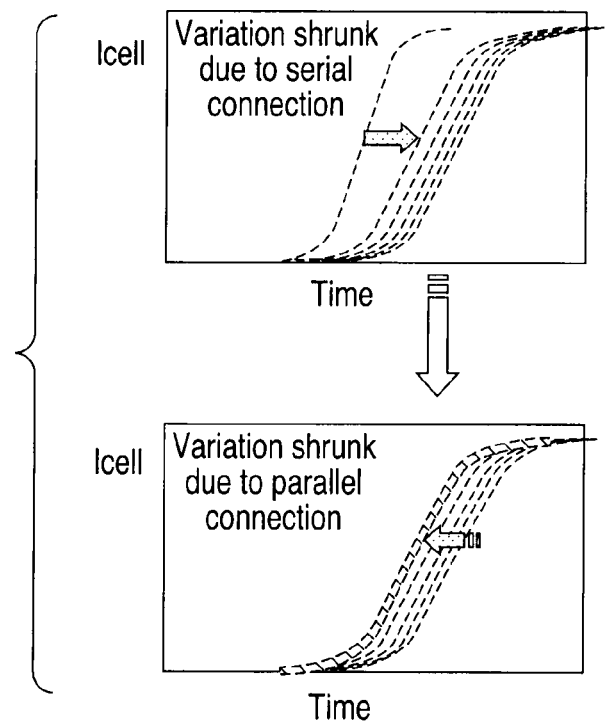
FIG. 10B is graphs for explaining a factor determining a lifetime of the aging device in FIG. 10A.

In this embodiment, such strings are further connected in parallel. As shown in FIG. 10A, fives strings, each including three pairs of cells demonstrating different lifetime characteristics, will now be considered. Since a cell having a long lifetime in each string determines a lifetime of each string, a variation between these cells having the long lifetimes becomes an entire variation. That is, as shown in an upper drawing in FIG. 10B, since the cells having a medium lifetime and cells having a short lifetime are cut off in each string, a variation should be greatly reduced at this point in time. Moreover, in this embodiment, the long-lifetime cells are arranged in parallel in accordance with each string, a cell having the shortest lifetime in these long-lifetime cells determines an entire lifetime.

Figure 8A:
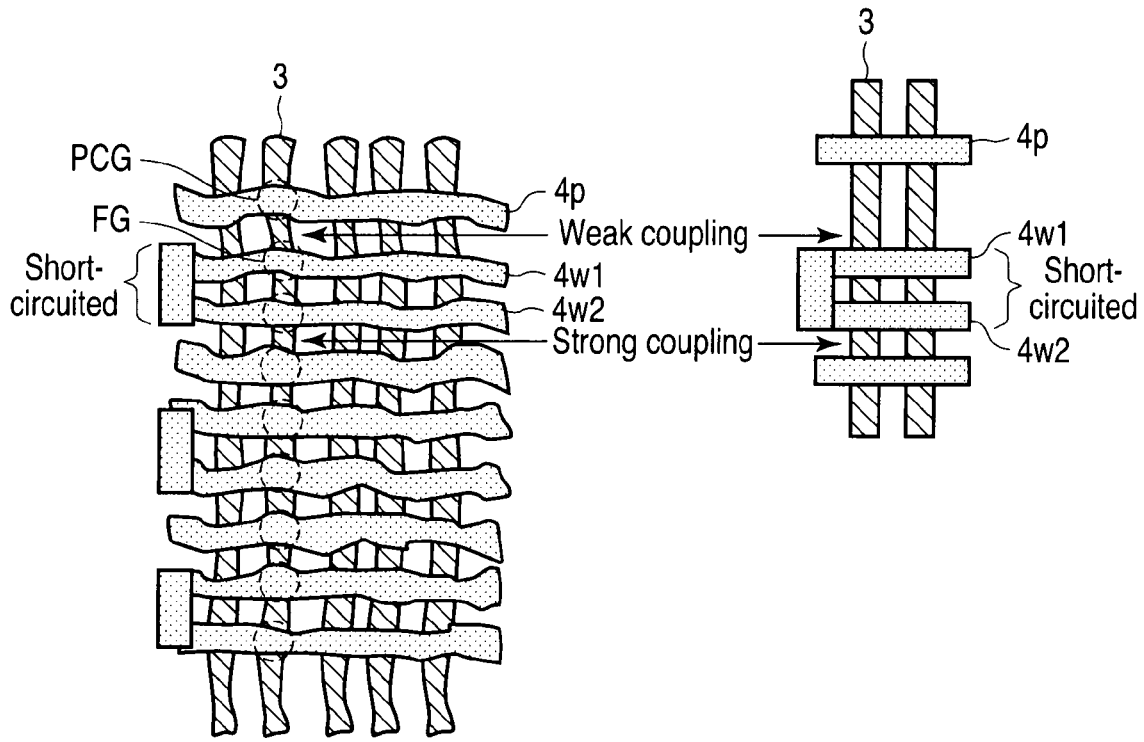
FIG. 8A is a view for further explaining FIG. 7B in detail.
Figure 8B:
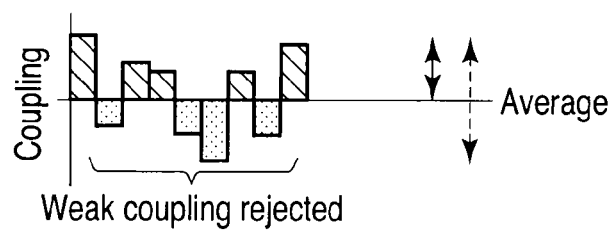
FIG. 8B is a view for explaining an influence on a variation in strong coupling and weak coupling.

Each pair of gate conductor lines is bundled to cut off a half or more of a process variation as shown in FIGS. 8A and 8B, the cell pairs are connected in series to cut off cells other than the long-lifetime cells in each string as shown in FIGS. 9A and 9B, and these cell pairs are further connected in parallel, whereby the cell having the shortest lifetime in the remaining long-lifetime cells determines an entire lifetime.

Figure 11:
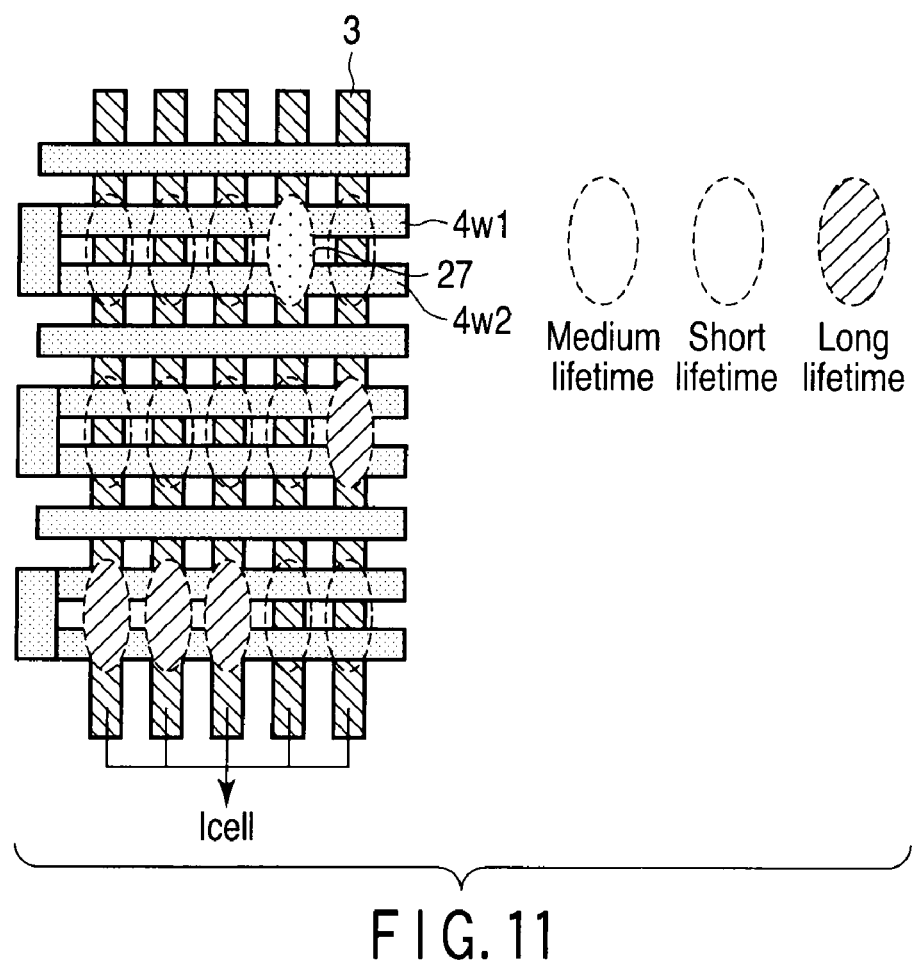
FIG. 11 is a view for explaining how one of aging cells formed in series in a plurality of active areas determines a lifetime of an aging device.

This represents that only one cell pair 27 in the cell array determines a lifetime of the aging device according to this embodiment as shown in FIG. 11, though it cannot be specified which cell determines the lifetime.

Figure 12:
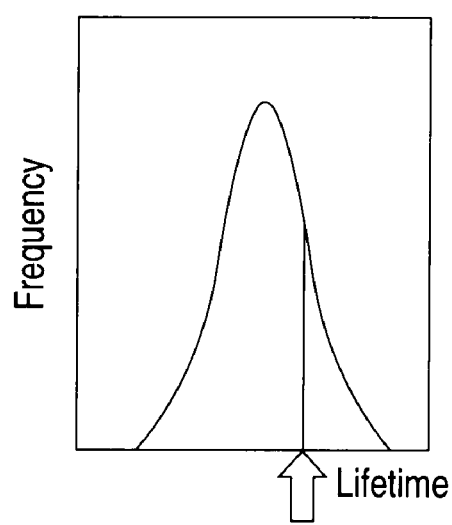
FIG. 12 is a graph for explaining where the lifetime determining cell is positioned in a statistical aggregate.

FIG. 12 shows a position in a statistical aggregate where this cell is placed. Even if which cell in the cell array corresponds to this cell cannot be specified, a distribution curve becomes smooth, as shown in the drawing, and lifetime characteristics of the corresponding cell can be readily estimated when the number of cells in the cell array is sufficiently increased. When the number of cells in the cell array is reduced, this distribution curve becomes distorted, and the lifetime characteristics of a corresponding cell becomes hard to be estimated.

In this manner, if a lifetime in the cell array having the sufficient number of cells is once measured, performing verification in such a manner that the lifetime of this cell becomes a desired lifetime can suffice when repeatedly using this cell.

Figure 13:
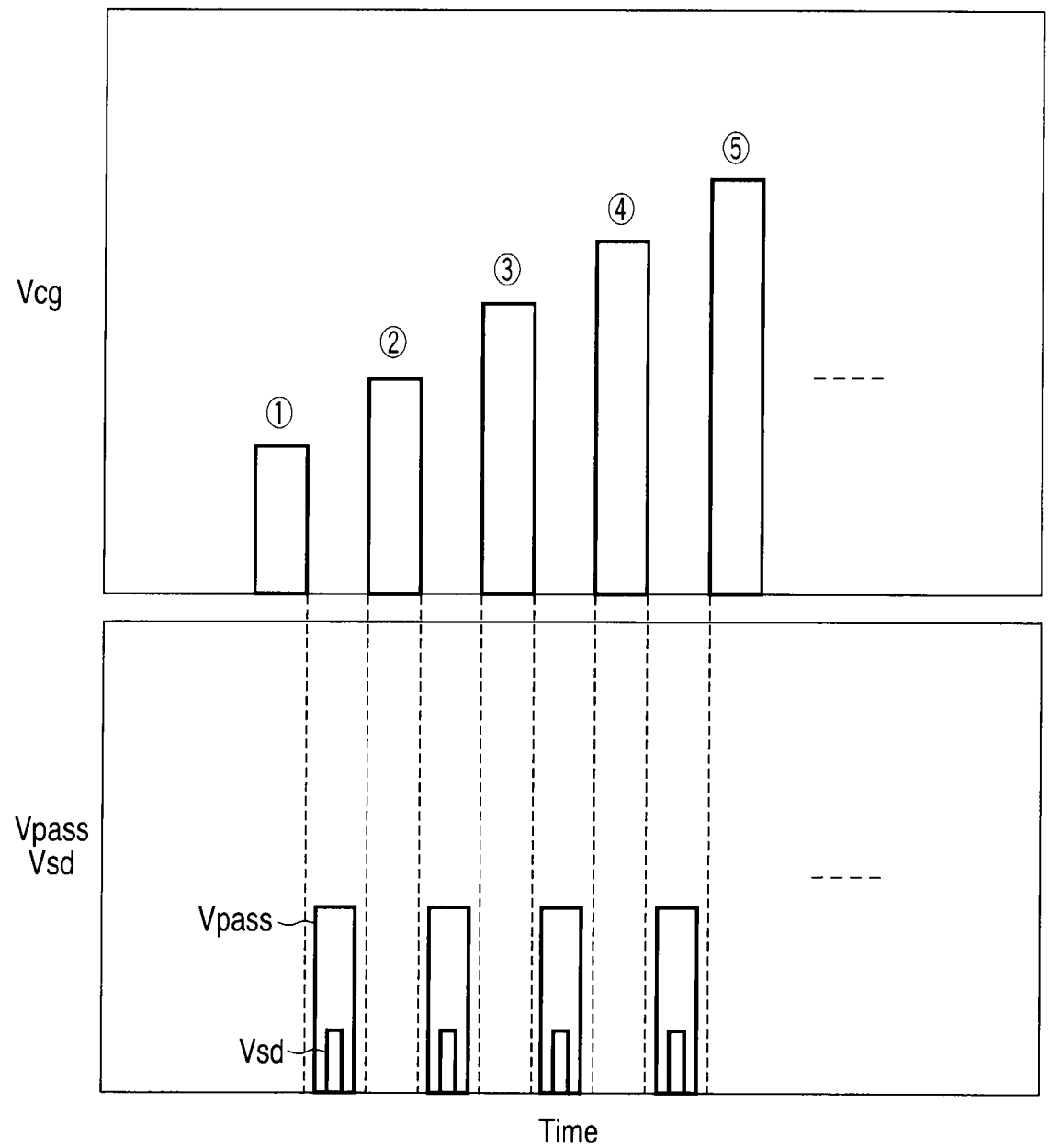
FIG. 13 is a time chart for explaining verification of a lifetime of an aging device.

A conventional verifying method for an aging device has been already disclosed in a prior application (JP-A 2008-103675 (KOKAI)) of the present inventor. According to this method, for example, as shown in FIG. 13, a writing voltage Vcg is gradually increased to control a quantity of electric charges injected into a floating gate. A voltage Vpass that is used to turn on a selecting gate transistor is applied at each interval between rectangular pulses 1, 2, 3, 4, 5 . . . in order to perform reading. A reading pulse Vsd is applied to a space between a source and a drain while this Vpass is applied. Writing is terminated when read data reaches an expected value. In the example of FIG. 13, the writing voltage Vcg is gradually increased, but a voltage may be fixed and a writing pulse width may be gradually increased.

A verifying method in this embodiment will now be explained. Writing (W), erasing (E), and reading (R) in the pseudo control gate (PCG) and the floating gate (FG) must be repeated, but W/E/R in the PCG and W/E/R in the FG may be independently or simultaneously performed. FIG. 14 shows an example of a recipe of verification which corresponds to a case where W/E/R in the PCG and the FG are mixed and carried out.

First, erasing is performed in the FG (S1), and erasing is effected in the PCG (S2). Subsequently, writing is carried out in the FG (S3), and erasing is performed in the PCG (S4). That is because weak writing may possibly be executed in the PCG at the time of writing in the FG. Since erasing is carried out in the PCG here, erasing in the PCG at S2 can be omitted. Then, writing is carried out in the PCG (S5), and reading is performed in the PCG (S6). Finally, reading is effected in the FG (S7). Reading may be first performed in the FG, and reading in the PCG may be carried at the end. The steps from S3 to S7 are repeated until a threshold value of each of the FG and the PCG becomes a desired value.

Each of writing, erasing, and reading methods used in the verification will now be explained. FIG. 15 is a view for explaining the writing method in the PCG. 4V is applied to the common word line (WL), 0V is applied to the source of the electron booster 2, 10V is applied to the drain of the same, 0V is applied to the source of the cell, and 0V is applied to the drain (BL) of the cell. Note that the electron booster 2 is represented as one MOS transistor.

When a ring booster is used as the electron booster 2, electrons collected from a ring outer peripheral portion become hot electrons in a ring inner peripheral portion, and the hot electrons are boosted to the gate of the booster 2 by a voltage applied to the PCG 20 and injected into the PCG 20 (19) via the PCG line based on coupling of the CG 18 and the PCG 20 through the common WL 11.

FIG. 16 is a view for explaining an erasing method in the PCG. 0V is applied to the common WL, 15V is applied to each of the source, the drain, and the substrate of the electron booster 2, and 0V is applied to the source and the drain of the cell portion 1. In this manner, electrons in the PCG 20 (19) are drawn out based on Fowler-Nordheim tunneling (FN tunneling) in the electron booster 2.

FIG. 17 is a view for explaining a reading method in the PCG. The electron booster 2 is regarded as a huge capacitor, and the drawing is simplified. $V_2$ denotes a voltage applied to the source, the drain, and the substrate of the electron booster in common. $V_1$ designates a voltage applied to the common WL. First, $V_1=10V$ is set, and a channel below the FG (not shown) is turned on. In this state, $V_2=12V$ is set, a voltage of 1V is applied to a space between the source terminal 9 and the drain terminal 10 to sense the cell current (Icell). In this manner, a quantity of electric charges stored in the PCG 20 (19) is read out.

FIG. 18 is a view for explaining writing in the FG. 20V is applied to the common WL, 0V is applied to the source and the drain of the electron booster 2, and 0V is likewise applied to the source 9 and the drain 10 of the cell portion 1. Then, electrons are injected into the FG 17 in the cell portion 1 based on FN tunneling.

FIG. 19 is a view for explaining an erasing method in the FG. 0V is applied to the common WL, 0V is applied to the source and the drain of the electron booster 2, 20V is applied to the source 9, the drain 10, and the substrate 16 of the cell portion 1, and electrons are drawn out from the FG 17 in the cell portion 1 based on FN tunneling.

Figure 20:
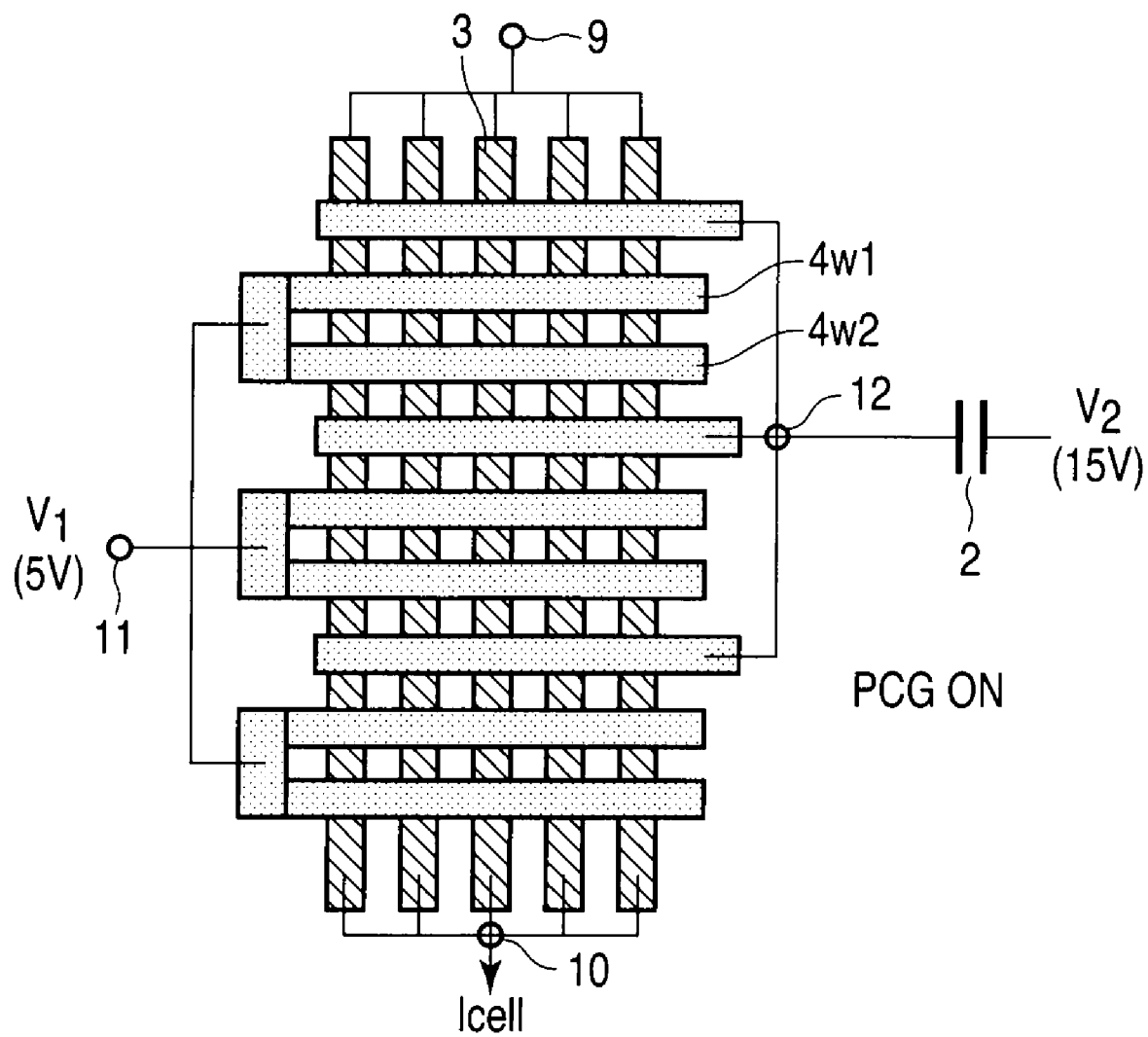
FIG. 20 is a view for explaining reading data from the floating gates in the aging device according to the first embodiment.

FIG. 20 is a view for explaining a reading method in the FG 17. 15V is applied to the source, the drain, and the substrate of the electron booster 2, and 5V is applied to the common WL 11 in a state where the PCG 20 (19) is in an ON state. Further, a voltage of 1V is applied to the space between the source terminal 9 and the drain terminal 10. In this manner, the cell current (Icell) is read out.

Using the above-explained methods enables verifying a lifetime of the cell as a desired lifetime. As a result, it is possible to realize an aging device which can be manufactured in a process common to the NAND type flash memory and has a high lifetime accuracy.

Second Embodiment

Figure 21:
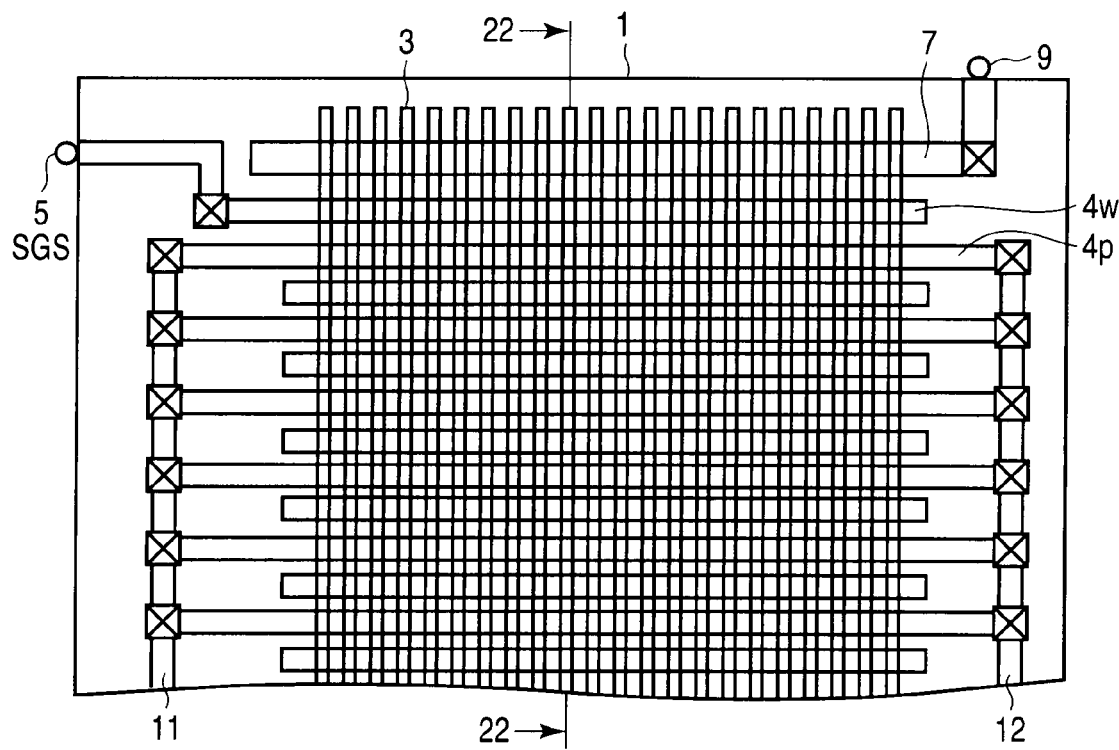
FIG. 21 is a plan view for explaining a primary part of a cell portion in an aging device according to a second embodiment.

FIG. 21 is a plan view for explaining a half of a cell portion on a common source side in an aging device according to a second embodiment. One difference from the first embodiment lies in that each PCG conductor line 4p and each gate conductor line 4w are alternately aligned. Other structures are the same as those in the first embodiment, and hence like reference numerals denote like parts, thereby omitting a detailed explanation thereof.

Figure 22:
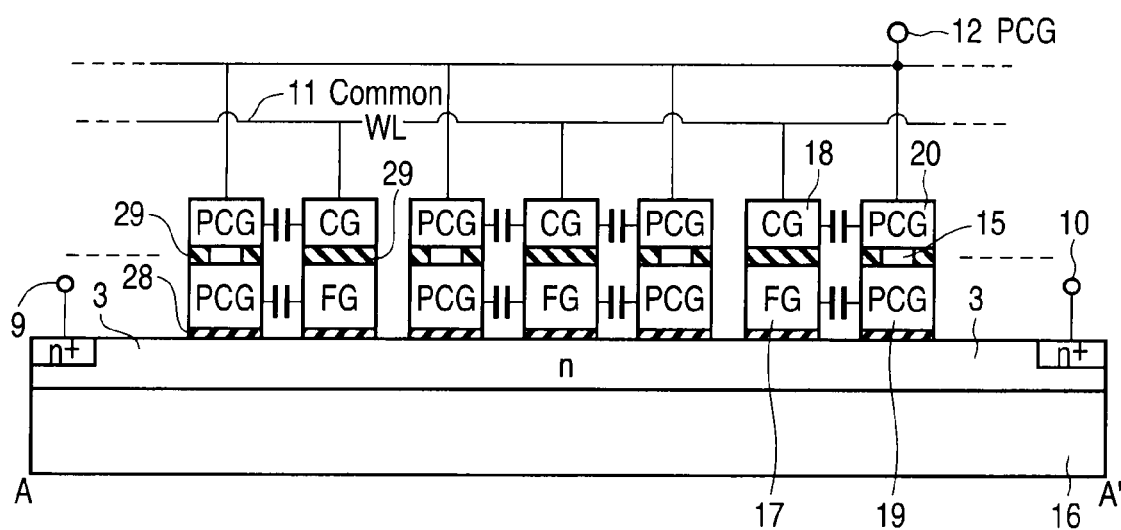
FIG. 22 is a cross-sectional view taken along a line 22-22 in FIG. 21.

FIG. 22 is a cross-sectional view taken along a line 22-22 in FIG. 21. In this manner, two gate conductor lines 4 do not have to be bundled, but three or more gate conductor lines 4 cannot be bundled. That is because a CG 18 that is not affected by a PCG 20 (19) remains. The PCG 20 (19) and the CG 18 must necessarily be adjacent to each other.

According to a second embodiment, since the two gate conductor lines 4 connected to a common word line do not have to be bundled, a packaging density can be improved, and the same effect as that in the first embodiment can be demonstrated. However, in regard to formation of a contact, more technologies are required than the first embodiment.

Third Embodiment

Figure 23:
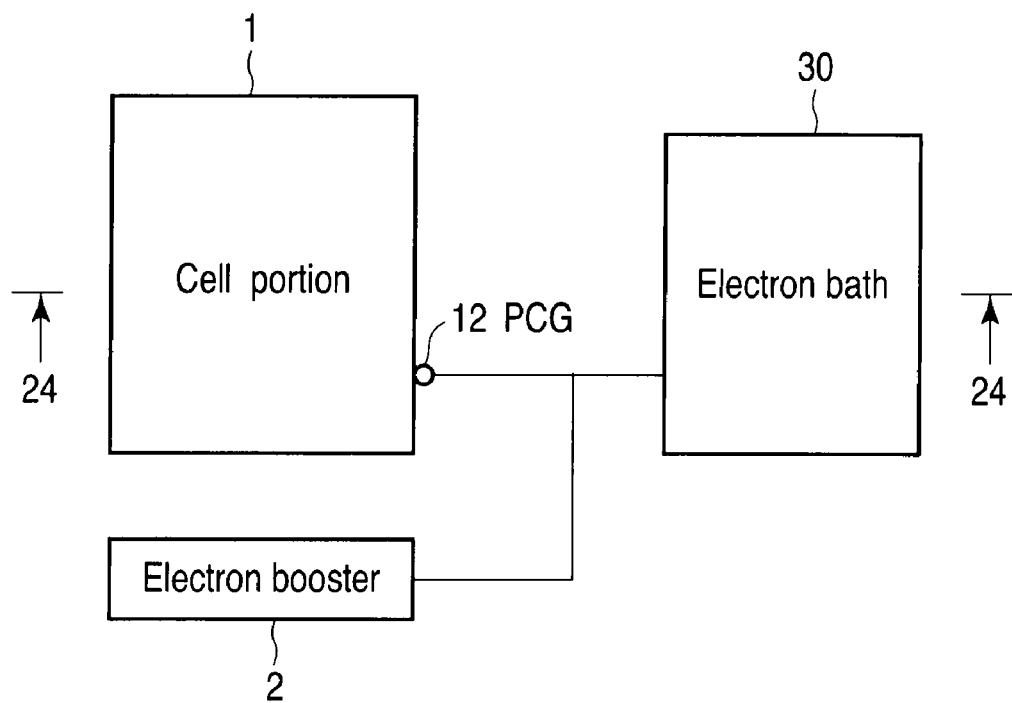
FIG. 23 is a schematic layout chart of an aging device according to a third embodiment.

FIG. 23 is a schematic plan view of an aging device according to a third embodiment. A cell portion 1 and an electron booster 2 are the same as those in the first or second embodiment. A wide conductor area 30 spreads on the right-hand side of a wiring line of a PCG pulled out on the right-hand side of the cell portion 1. This is an electron bath where electrons boosted in a gate of the electron booster 2 are stored.

Figure 24:
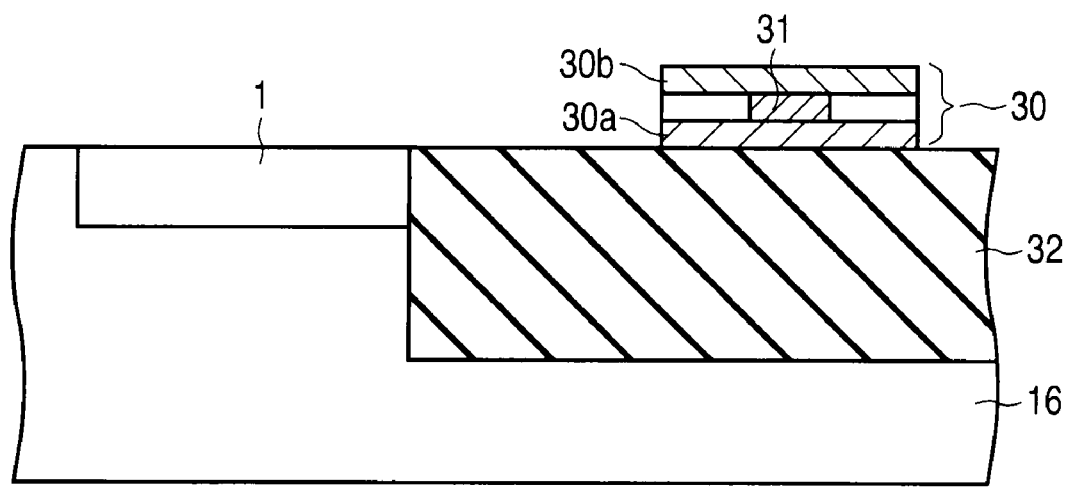
FIG. 24 is a view for explaining an electron bath according to the third embodiment and it is also a cross-sectional view taken along a line 24-24 in FIG. 23.

FIG. 24 is a view corresponding to a cross section taken along a line 24-24 in FIG. 23, a part below the electron bath 30 is an insulating film 32, and capacitive coupling with an active area 3 of the cell portion 1 is not present. It is to be noted that a lower conductor 30a is connected to an upper conductor 30b through a conductive material 31 in the conductor area 30 in FIG. 24 because they are formed in the same process as that of a layer in which an FG and a CG of a first linear conductor layer 4w are formed. Of course, the lower conductor 30a alone may be formed, or the upper conductor 30b alone may be formed.

According to the third embodiment, since electrons boosted by the electron booster 2 are stored in the electron bath 30, a lifetime of a PCG cell can be maintained longer than a lifetime of a time cell (an FG cell) without leaking electrons which are injected into a PCG 20 (19), thereby improving reliability of the aging device.

It is to be noted that each conductor layer, e.g., the gate conductor or the electron bath explained in the first to third embodiments may be any one of a polysilicon layer, a silicide layer, and a metal layer. Further, the silicide layer is a layer formed of a silicide of a metal element such as nickel, cobalt, tungsten, titanium, or platinum.

As explained above, according to the embodiments of the present invention, it is possible to realize an aging device that can be manufactured in the same process as a NAND flash memory and control a variation in lifetime.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor time switch comprising:
   a semiconductor substrate;
   a cell portion provided on the semiconductor substrate and including a first input/output terminal, a second input/output terminal and a pseudo control gate terminal, the cell portion including,
      a plurality of linear semiconductor layers formed on the semiconductor substrate in parallel with each other in a first direction and serving as active areas, one end of each linear semiconductor layer being connected to the first input/output terminal and the other end being connected to the second input/output terminal in the cell portion,
      a plurality of first gate insulating films formed on the linear semiconductor layers,
      a plurality of first linear conductor layers formed on the first gate insulating films in parallel with each other, extended in a second direction crossing the first direction, and serving as control gates,
      a plurality of second linear conductor layers formed on the first gate insulating films in parallel with each other, extended in the second direction, and arranged alternately with the first linear conductor layers,
      floating gates inserted in intersections of the linear semiconductor layers and the first linear conductor layers, provided on the first gate insulating films, and coupled to the first linear conductor layers through inter-gate insulating films, and
      first selecting transistors inserted between one end portion of the linear semiconductor layers and the first input/output terminal, and second selecting transistors inserted between an other end portion of the linear semiconductor layers and the second input/output terminal, a source region of each first selecting transistor is connected to the first input/output terminal, and a drain region of each second selecting transistor is connected to the second input/output terminal; and
   an electron booster provided on the semiconductor substrate and connected to the pseudo control gate terminal, the electron booster including a MOS transistor having a first source region and a first drain region formed on the semiconductor substrate, a second gate insulating film formed on a semiconductor region between the first source region and the first drain region, and a booster gate electrode formed on the second gate insulating film, the booster gate electrode being connected to the second linear conductor layers through the pseudo control gate terminal of the cell portion.

2. The semiconductor time switch according to claim 1, wherein, in the MOS transistor of the electron booster, the first source region is formed so as to have portions sandwiching the first drain region with the second gate electrode interposed therebetween.

3. The semiconductor time switch according to claim 1, further comprising:
   an insulating film buried in a trench formed in a surface of the semiconductor substrate; and
   a conductor region formed on the insulating film and connected to the booster gate electrode.

4. The semiconductor time switch according to claim 3, wherein the conductor region includes a layer portion the same as a layer forming the floating gates and a layer portion the same as the first linear conductor layers, and the same layer portion of the floating gates is connected to the same layer portion of the first linear conductor layers through a first conductive material.

5. The semiconductor time switch according to claim 3, wherein the conductor region is formed of a material selected from the group consisting of polysilicon, nickel, tungsten, cobalt, titanium, platinum, metal silicide, aluminum, copper, and gold.

6. The semiconductor time switch according to claim 1, wherein the second linear conductor layer includes a layer portion the same as a layer forming the floating gates and a layer portion the same as the first linear conductor layers, and the same layer portion of the floating gates is connected to the same layer portion of the first linear conductor layers through a first conductive material.

7. The semiconductor time switch according to claim 1, wherein each of the plurality of first linear conductor layers is formed of two sub-linear conductor layers which are adjacent to each other in parallel.

8. The semiconductor time switch according to claim 1, wherein each of the booster gate electrode, first gate electrodes of the first selecting transistors and second gate electrodes of the second selecting transistors is a laminated electrode including a layer portion the same as a layer forming the floating gates and a layer portion the same as the first linear conductor layers of the cell portion, and the same layer portion of the floating gates is connected to the same layer portion of the first linear conductor layers through a first conductive material.

9. The semiconductor time switch according to claim 1, wherein the first linear conductor layers and the second linear conductor layers are formed of a material selected from the group consisting of a polysilicon, nickel, tungsten, cobalt, titanium, platinum, metal silicide, aluminum, copper, and gold.

10. A semiconductor time switch comprising:
a semiconductor substrate;
a cell portion provided on the semiconductor substrate and including a first input/output terminal, a second input/output terminal and a pseudo control gate terminal, the cell portion including,
a plurality of linear semiconductor layers formed on the semiconductor substrate in parallel with each other in a first direction and serving as active areas, one end of each linear semiconductor layer being connected to the first input/output terminal and the other end of each linear semiconductor layer being connected to the second input/output terminal in the cell portion,
a plurality of first gate insulating films formed on the linear semiconductor layers,
a plurality of first linear conductor layers formed on the first gate insulating films in parallel with each other, extended in a second direction crossing the first direction, and serving as control gates,
a plurality of second linear conductor layers formed on the first gate insulating films in parallel with each other, extended in the second direction, and arranged to be adjacent to the first linear conductor layers,
floating gates inserted in intersections of the linear semiconductor layers and the first linear conductor layers, provided on the first gate insulating films, and coupled to the first linear conductor layers through inter-gate insulating films, and
first selecting transistors inserted between one end portion of the linear semiconductor layers and the first input/output terminal, and second selecting transistors inserted between an other end portion of the linear semiconductor layers and the second input/output terminal, a source region of each first selecting transistor is connected to the first input/output terminal, and a drain region of each second selecting transistor is connected to the second input/output terminal; and
an electron booster provided on the semiconductor substrate and connected to the pseudo control gate terminal, the electron booster including an MOS transistor which has a first source region formed on the semiconductor substrate, a first drain region formed on the semiconductor substrate, a second gate insulating film formed on a semiconductor region between the first source region and the first drain region, the first source region having portions sandwiching the first drain region with the second gate insulating film interposed therebetween and a booster gate electrode formed on the second gate insulating film, the booster gate electrode being connected to the second linear conductor layers through the pseudo control gate terminal of the cell portion.

11. The semiconductor time switch according to claim 10, further comprising:
an insulating film buried in a trench formed in a surface of the semiconductor substrate; and
a conductor region formed on the insulating film and connected to the booster gate electrode.

12. The semiconductor time switch according to claim 11, wherein the conductor region includes a layer portion the same as a layer forming the floating gates and a layer portion the same as the first linear conductor layers, and the same layer portion of the floating gates is connected to the same layer portion of the first linear conductor layers through a first conductive material.

13. A semiconductor time switch comprising:
a semiconductor substrate;
a cell portion provided on the semiconductor substrate and including a first input/output terminal, a second input/output terminal and a pseudo control gate terminal, the cell portion including,
a plurality of linear semiconductor layers formed on the semiconductor substrate in parallel with each other in a first direction and serving as active areas, one end of each linear semiconductor layer being connected to the first input/output terminal and the other end of each linear semiconductor layer being connected to the second input/output terminal in the cell portion,
a plurality of first gate insulating films formed on the linear semiconductor layers,
a plurality of first linear conductor layers formed on the first gate insulating films in parallel with each other, extended in a second direction crossing the first direction, and serving as control gates,
a plurality of second linear conductor layers formed on the first gate insulating films in parallel with each other, extended in the second direction, and arranged to be adjacent to the first linear conductor layers,
floating gates inserted in intersections of the linear semiconductor layers and the first linear conductor layers, provided on the first gate insulating film, and coupled to the first linear conductor layers through inter-gate insulating films, and
first selecting transistors inserted between one end portion of the linear conductor layers and the first input/output terminal, and second selecting transistors inserted between an other end portion of the linear conductor layers and the second input/output terminal, source regions of the first selecting transistors are connected to the first input/output terminal, and drain regions of the second selecting transistors are connected to the second input/output terminal;

an electron booster provided on the semiconductor substrate and connected to the pseudo control gate terminal, the electron booster including an MOS transistor having a first source region and a first drain region formed on the semiconductor substrate, a second gate insulating film formed on a semiconductor region between the first source region and the first drain region, and a booster gate electrode formed on the second gate insulating film, the booster gate electrode being connected to the second linear conductor layers through the pseudo control gate terminal of the cell portion;

an insulating film buried in a trench formed in a surface of the semiconductor substrate; and a conductor region formed on the insulating film and connected to the booster gate electrode.

14. The semiconductor time switch according to claim 13, wherein the conductor region includes a layer portion the same as a layer forming the floating gates and a layer portion the same as the first linear conductor layers, and the same layer portion of the floating gates is connected to the same layer portion of the first linear conductor layers through a first conductive material.

15. The semiconductor time switch according to claim 13, wherein the second linear conductor layer includes a layer portion the same as a layer forming the floating gates and a layer portion the same as the first linear conductor layers, and the same layer portion of the floating gates is connected to the same layer portion of the first linear conductor layers through a second conductive material.

16. The semiconductor time switch according to claim 13, wherein each of the plurality of first linear conductor layers is formed of two sub-linear conductor layers which are adjacent to each other in parallel.

17. The semiconductor time switch according to claim 13, wherein each of the booster gate electrode, first gate electrodes of the first selecting transistors, and second gate electrodes of the second selecting transistors is a laminated electrode including a layer portion the same as a layer forming the floating gates and a layer portion the same as the first linear conductor layers of the cell portion, and the same layer portion of the floating gates is connected to the same layer portion of the first linear conductor layers through a first conductive material.

18. The semiconductor time switch according to claim 13, wherein each of the first linear conductor layers, the second linear conductor layers and the conductor region is formed of a material selected from the group consisting of polysilicon, nickel, tungsten, cobalt, titanium, platinum, metal silicide, aluminum, copper, and gold.

* * * * *